(12) United States Patent
Guinea et al.

(10) Patent No.: US 7,106,822 B1
(45) Date of Patent: Sep. 12, 2006

(54) BIDIRECTIONAL SYNCHRONOUS INTERFACE WITH SINGLE TIME BASE

(75) Inventors: Jesus Guinea, Bergamo (IT); Luciano Tomasini, Milan (IT)

(73) Assignee: STMicroelectronics S.r.l., Agrate Brianza (IT)

(*) Notice: Subject to any disclaimer, the term of this patent is extended or adjusted under 35 U.S.C. 154(b) by 916 days.

(21) Appl. No.: 09/632,385

(22) Filed: Aug. 3, 2000

(30) Foreign Application Priority Data

Aug. 6, 1999 (EP) .................. 99830518

(51) Int. Cl.
*H03D 3/24* (2006.01)
*H04L 7/00* (2006.01)

(52) U.S. Cl. ..................... 375/375; 375/354

(58) Field of Classification Search ........... 375/354, 375/355, 376, 327, 229, 220, 375; 370/508, 370/507, 509, 510
See application file for complete search history.

(56) References Cited

U.S. PATENT DOCUMENTS

| | | | | |
|---|---|---|---|---|
| 4,562,422 A | * | 12/1985 | Pospischil | 341/73 |
| 4,677,648 A | | 6/1987 | Zurfluh | 375/120 |
| 4,783,791 A | * | 11/1988 | Yoshino | 375/211 |
| 5,052,022 A | * | 9/1991 | Nishita et al. | 375/215 |
| 5,488,641 A | * | 1/1996 | Ozkan | 375/374 |
| 5,764,092 A | | 6/1998 | Wada et al. | 327/271 |
| 6,122,336 A | * | 9/2000 | Anderson | 375/371 |
| 6,501,812 B1 | * | 12/2002 | Yada | 375/372 |

FOREIGN PATENT DOCUMENTS

| | | |
|---|---|---|
| EP | 0 153 107 | 8/1985 |
| EP | 0 714 190 | 5/1996 |
| JP | 409284347 A * | 10/1997 |

OTHER PUBLICATIONS

Maniatopoulos, et al. "A CMI Decoder with Single Bit Error Correction Capabilities", IEEE 195, p. 317-321.*

* cited by examiner

*Primary Examiner*—Mohammed Ghayour
*Assistant Examiner*—Sam K. Ahn
(74) *Attorney, Agent, or Firm*—Lisa K. Jorgenson; E. Russell Tarleton; Seed IP Law Group PLLC

(57) ABSTRACT

A bidirectional synchronous interface for the reception of a first flow of digital data with a first coding from a communication channel, and for the transmission on the communication channel of a second flow of digital data with the first coding in synchrony with a local timing signal. The interface includes a synchronization circuit for synchronizing the interface with the first flow of digital data that includes a first circuit fed by the local timing signal to generate, starting from the local timing signal, a plurality of repetition timing signals delayed from one another by fractions of a period, and a second circuit means fed by the first flow of digital data and by the plurality of repetition timing signals suitable for determining, from the plurality of repetition timing signals, a pre-selected repetition timing signal substantially in synchrony with the first flow of digital data.

22 Claims, 4 Drawing Sheets

BIDIRECTIONAL SYNCHRONOUS INTERFACE WITH SINGLE TIME BASE

TECHNICAL FIELD

The present invention relates to the field of synchronous data transmission according to the SDH (Synchronous Digital Hierarchy) standard. More particularly, the invention concerns a bidirectional synchronous interface (transceiver) for use in digital networks structured according to the SDH standard.

BACKGROUND OF THE INVENTION

As is known, the SDH standard prescribes pre-established transmission velocities: 51.84 Mbit/sec. (base velocity), 155.52 Mbit/sec., 622.08 Mbit/sec. etc. The prescribed transmission velocities are all whole multiples of the base velocity.

Within the scope of the SDH standard, recommendation G.703 issued by the CCITT committee of the International Telecommunication Union (ITU) prescribes the electro-physical characteristics of the hierarchical digital interfaces to be used for interconnecting components of digital networks which conform to the SDH standard. In particular, recommendation G.703 prescribes the type of coding of the data to be used for each transmission velocity: for example, for the transmission/reception interfaces (also termed bidirectional interfaces or "transceivers") at 155.52 Mbit/sec. the CMI coding should be used. The CMI coding is a code with two levels, A1 and A2, in which a binary "0" is coded so as to present the two levels A1 and A2 in succession, each for a time equal to half the bit time, while a binary "1" is coded by means of one or other of the two levels A1 or A2 maintained for the whole bit time; the two levels A1, A2 are alternated with each other for successive binary "1"s.

The interface is generally associated with digital circuits for processing the data received and/or to be transmitted, which typically operate on differently coded data, for example according to the NRZ (Non-Return to Zero) coding. In reception, the interface should therefore receive, from a remote analogous interface through a transmission/reception channel consisting, for example, of a pair of coaxial cables, a signal carrying CMI-coded data, recognize them and convert them into NRZ, and deliver them to the digital circuits which are to process them. In transmission, the interface should receive from the digital processing circuits NRZ-coded data, recognize them and convert them into CMI, and pass them to the transmission/reception channel.

It being a matter of synchronous data transmission, the question of timing is of maximum importance.

In transmission, it is necessary to have available a clock signal having a period equal to half the bit time. Since a high precision and a low "jitter" must be guaranteed, use is normally made of a local oscillator in a phase locked loop (PLL for short).

In reception, the CMI-coded signal is processed in order to extract, or recover, a clock signal (strobe), necessary for synchronizing the interface with the flow of data received, which is then used to recognize the bits of data and NRZ-code them.

There are three known techniques for the recovery of the clock signal in reception (RX clock recovery) by the interfaces. A first technique makes use of an analog PLL which tracks a signal having double the frequency with respect to the frequency of the bits of data. In a second technique, a resonator tuned to twice the bit frequency is used. In a third technique, use is made of quadri-correlator circuits. In all cases, it is necessary to start from a local clock signal, different from that used for transmission. In the interface there are therefore two separate time bases, one for transmission and one for reception.

The use of two separate time bases, one for transmission and the other for reception, has drawbacks from various points of view. Apart from the obvious problem of increase in the circuit area, in the cost in terms of components, and in power consumption, there are problems of interference (cross-talk) between the two clock signals, having a very similar frequency to each other, which can give rise to beating, with a negative effect on performances.

SUMMARY OF THE INVENTION

In view of the state of the art described, the disclosed embodiments of the present invention provide a bidirectional synchronous interface that solves the problems exhibited by the prior art.

According to the embodiments of the present invention, this aim is fulfilled by means of a synchronous bidirectional interface for the reception of a first flow of digital data with a first coding from a communication channel, and for the transmission on the communication channel of a second flow of digital data with the first coding in synchronization with a local timing signal. The bidirectional synchronous interface includes a synchronization circuit for synchronizing the interface with the first flow of digital data having a first circuit means fed by a local timing signal in order to generate, starting from the local timing signal, a plurality of repetition timing signals delayed from one another by fractions of a period, and a second circuit fed by the first flow of digital data and by the plurality of repetition timing signals suitable for determining, in the plurality, a preselected repetition timing signal substantially in synchronization with the first flow of digital data.

BRIEF DESCRIPTION OF THE DRAWINGS

The characteristics and advantages of the present invention will become clear from the following detailed description of one of its preferred embodiments, illustrated by way of non-limiting example in the appended drawings, in which.

DETAILED DESCRIPTION OF THE INVENTION

Figure 1:
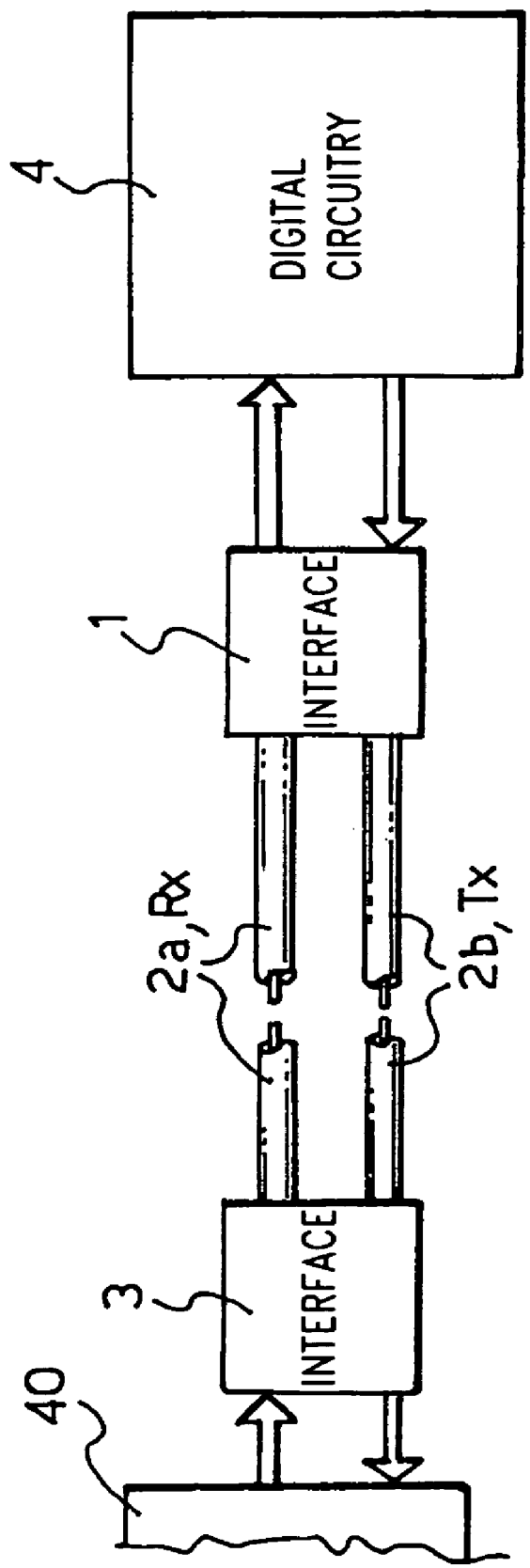
FIG. 1 shows diagrammatically a data transmission network in which an interface according to the present invention is used.

With reference to FIG. 1, a bidirectional synchronous, or transmission and reception, interface 1 receives on a first channel 2a, for example a coaxial cable, a flow of digital data, for example with CMI coding, from a remote analogous interface 3 (far end); the interface 1, in turn, transmits on a second channel 2b, which also consists for example of a coaxial cable, a flow of digital data with CMI coding to the remote interface 3. For the interface 1, the channel 2a is the reception channel (RX), while the channel 2b is the transmission channel (TX). The interface 1 communicates with digital circuitry 4 for the processing of the data received and to be transmitted; similarly, the remote interface 3 is associated with respective digital circuitry 40.

Figure 2:
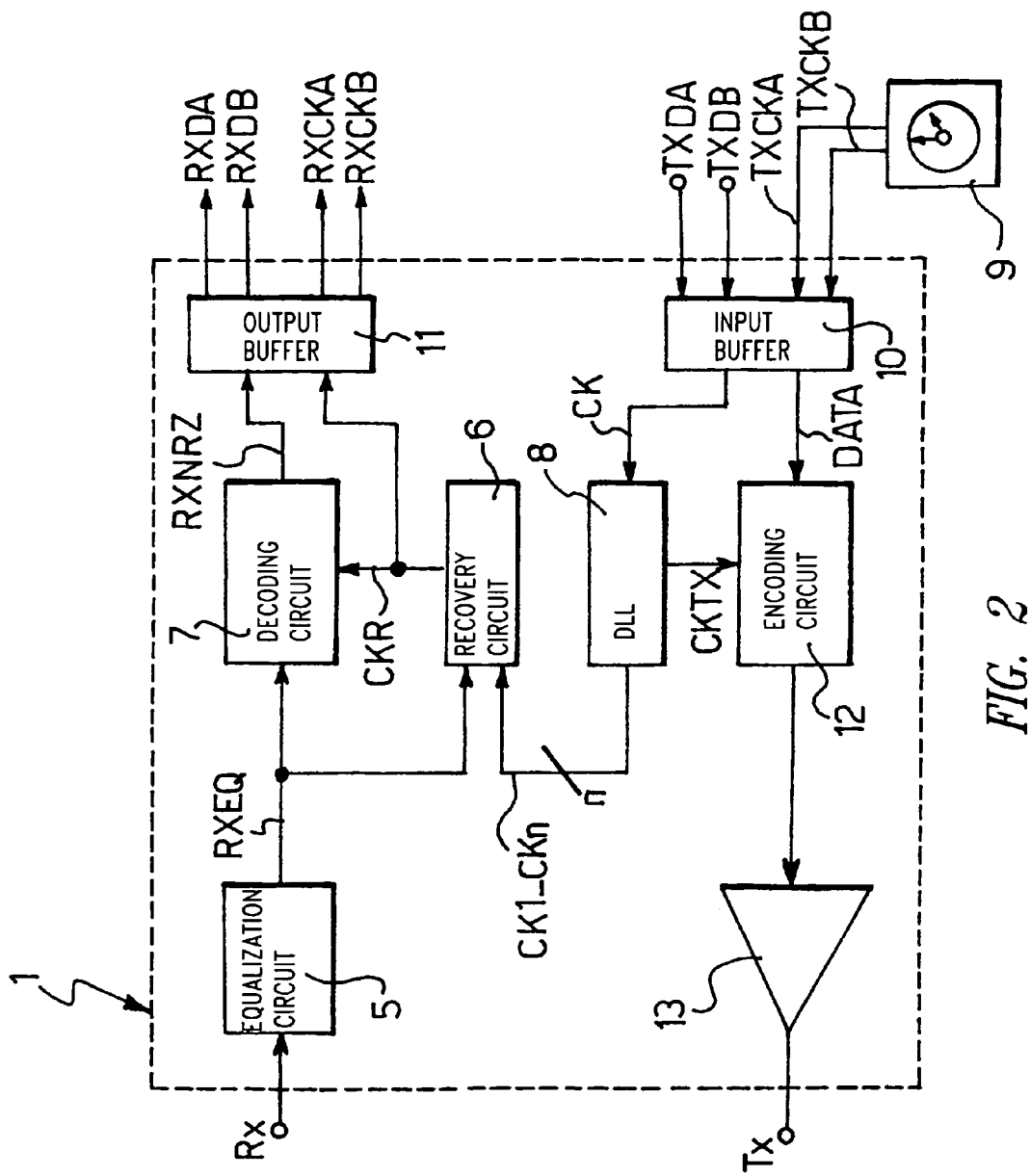
FIG. 2 shows the principal functional blocks of the interface according to the invention.

As shown in FIG. 2, the interface 1 comprises an equalization circuit 5 for the equalization in modulus and phase of the signal received on the reception channel RX. A signal RXEQ, still with CMI coding, issuing from the equalization circuit 5, is delivered in parallel to a circuit 6 for recovery of the timing signal in reception, and to a decoding circuit 7 for decoding the CMI-coded signal RXEQ into a corresponding RXNRZ signal, for example with NRZ coding, suitable for being delivered to the digital circuitry 4.

According to the invention, the circuit 6 for recovery of the timing signal in reception moreover receives n timing signals CK1–CKn of equal period T delayed from one another by T/n, where T is the bit time, that is to say, in the case of a synchronous interface for reception/transmission at 155.52 Mbit/sec., approx. 6.43 ns. For example, the signals CK1–CKn are sixteen signals, with the signal CKi+1 delayed by T/16 with respect to the signal CKi. The signals CK1–CKn are generated by a delay locked loop circuit (or DLL) 8 fed by a clock signal CK with period T. The clock signal CK is in turn generated by a local circuit 9, which generates a pair of differential signals TXCKA, TXCKB conforming to the levels LVDS (Low Voltage Differential Signal), and which, through an input buffer 10 of the LVDS/CMOS type, are transformed into the signal CK, conforming to the CMOS levels (for example 5 v or 3.3 v). The circuit 9 may, for example, be internal to the digital circuitry 4, and is used for generating a pair of differential signals TXDA, TXDB representing the flow of bits to be transmitted; the NRZ-coded signals TXDA, TXDB, through the input buffer 10, are transformed into a DATA signal, still NRZ-coded, which through a circuit 12 for coding from NRZ to CMI synchronized with a timing signal CKTX generated by the circuit 8, having a frequency equal to that of the signal CK but with duty cycle guaranteed substantially equal to 50%, and a successive operating circuit 13, is transformed into the signal TX to be transmitted.

The circuit 6 for recovery of the timing signal in reception generates a recovered timing signal CKR which is delivered to the decoding circuit 7, which in order to be able to effect the decoding of the CMI signal into NRZ must be synchronized with the flow of bits received.

The signal RXNRZ and the signal CKR are moreover delivered to the digital circuitry 4, after their levels have been transformed from CMOS to LVDS by means of an output buffer 11 of the CMOS/LVDS type similar to the input buffer 10 which transforms the signal RXNRZ into a pair of differential signals RXDA, RXDB, and the signal CKR into a pair of differential signals RXCKA, RXCKB.

Figure 3:
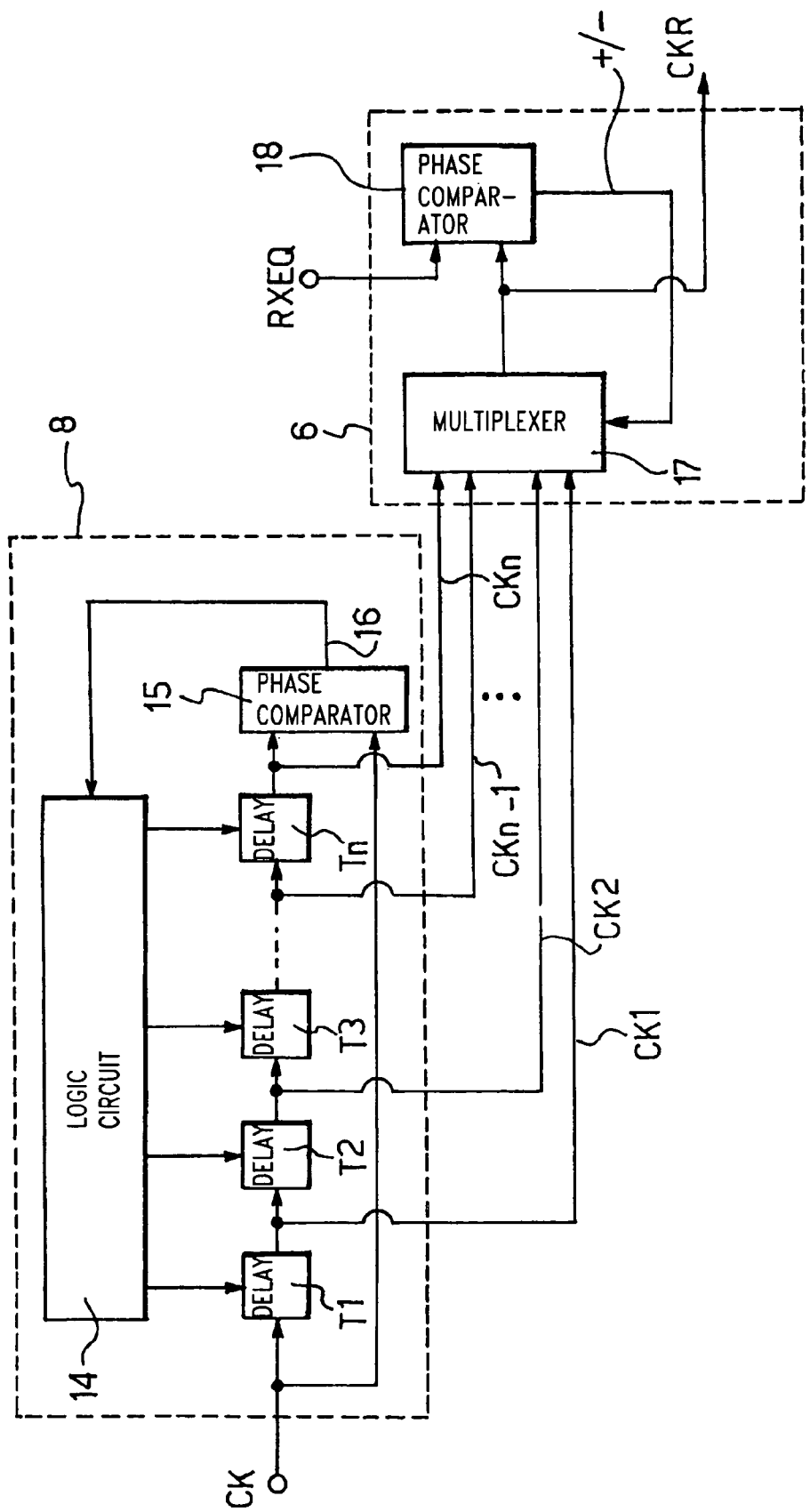
FIG. 3 shows in detail two functional blocks of the interface in FIG. 2.

FIG. 3 shows in greater detail the delay locked loop circuit 8 and the circuit 6 for recovery of the timing signal. The circuit 8 consists of a chain of n, for example sixteen, delay elements T1–Tn in cascade, controlled by a logic circuit 14 which receives an output signal 16 from a phase comparator 15. The chain of delay elements T1–Tn forms a controlled delay line. The overall delay introduced by the delay line T1–Tn is controlled so as to be equal to a period T of the signal CK. The phase comparator 15 receives in input and compares the signal CK and the signal CKn at the output of the last delay element Tn of the chain. The output signal 16 of the phase comparator 15 is a function of the phase difference found between the signals CK and CKn; the logic circuit 14 operates the delay elements T1–Tn so that the delay introduced by each of them is such that the signal CKn is in phase with the signal CK, less a period T.

The outputs CK1–CKn of the n delay elements T1–Tn are delivered to a selection circuit 17, substantially a multiplexer, of the recovery circuit 6; the output CKR of the multiplexer 17, corresponding to one of the n signals CK1–CKn, is delivered, together with the signal RXEQ, to a phase comparator 18 which, as a function of the phase difference between the signal RXEQ and the signal CKR, operates, through a +/− signal, the multiplexer 17 so that at the output CKR there is connected that signal, among the signals CK1–CKn, which is in synchrony, or in any case has the lesser phase difference, with respect to the signal RXEQ.

Figure 4:
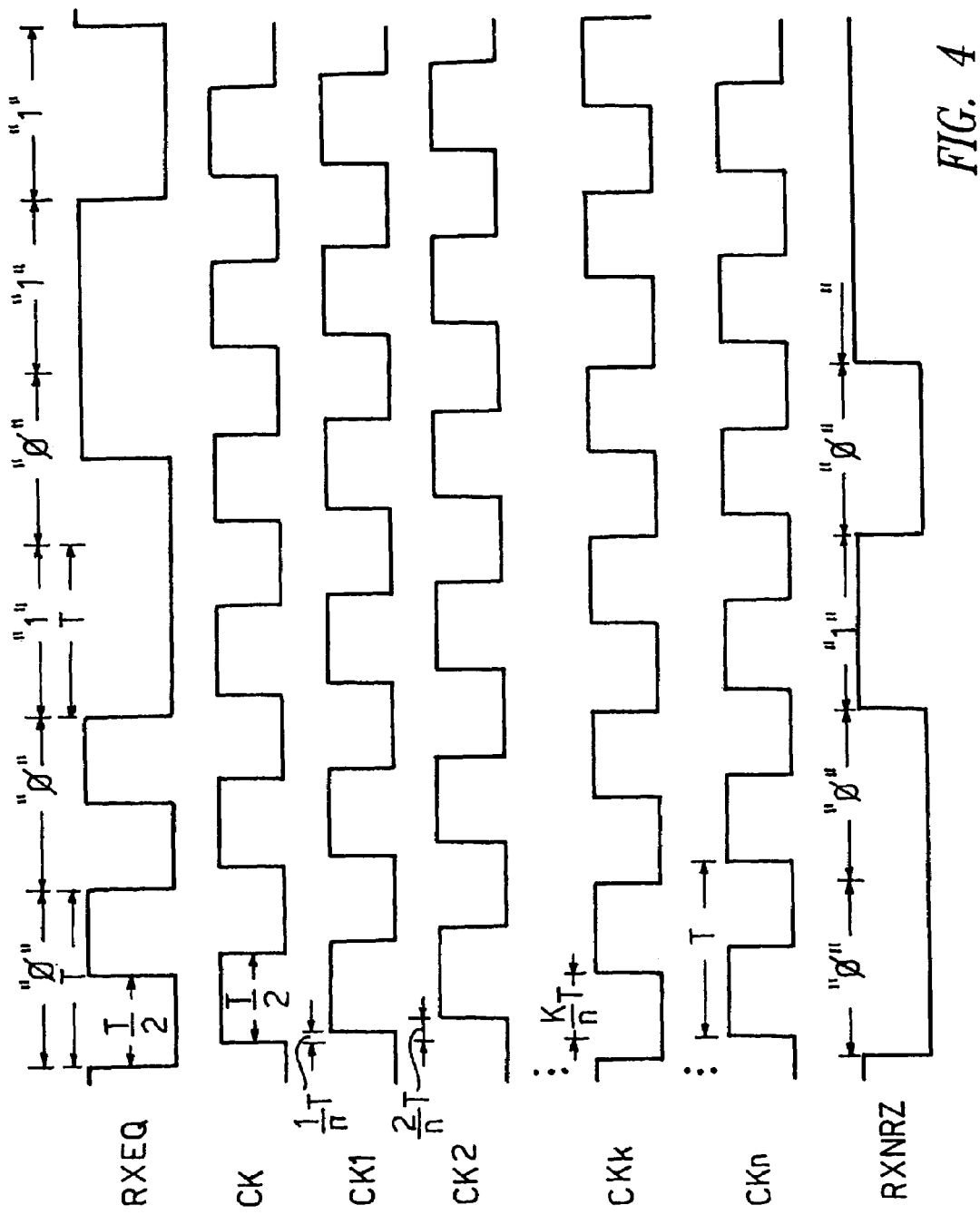
FIG. 4 is a time diagram of some more significant signals, shown in FIGS. 2 and 3.

With reference to the example in FIG. 4, to the output CKR of the recovery circuit 6 there will be delivered the signal CKk, delayed with respect to the timing signal CK by (k/n)T, which is synchronized with the signal RXEQ.

In this way the clock signal is recovered from the signal received, which signal can be delivered to the circuit 7 for decoding from CMI to NRZ. In other words, the interface is synchronized in reception with the flow of data received. FIG. 4 shows the signal RXNRZ corresponding to the signal RXEQ decoded by the circuit 7.

The interface according to the present invention has the advantage of requiring only one local timing signal, or a single time base, which is used both for transmission and for the recovery of the clock signal in reception. The timing of the interface both in reception and in transmission is therefore entrusted to a single time base. The need to provide two local oscillators with frequencies close to each other, and therefore the risk of crosstalk between the two timing signals, is eliminated. There is moreover a saving in terms of components and of power absorbed.

It is clear that variants of, and/or additions to, what has been described and illustrated above may be provided. Hence, the invention is to be limited only by the scope of the claims that follow and the equivalents thereof.

We claim:

1. A bidirectional synchronous interface for a digital circuit configured for the reception of a first flow of digital data from a remote circuit with a first coding on a first communication channel, and for transmission to the remote circuit on a second communication channel of a second flow of digital data received from the digital circuit with a second coding and encoded with the first coding in synchrony with a local timing signal, the bidirectional synchronous interface comprising:

synchronization means for synchronizing the interface with the first flow of digital data with the second coding, said synchronization means comprise first circuit means that comprise a delay locked loop circuit fed by said local timing signal generated from a single time base in order to derive, starting from said local timing signal, a plurality of repetition timing signals delayed from one another by fractions of a period and a transmission timing signal;

second circuit means fed by said first flow of digital data and by said plurality of repetition timing signals suitable for determining the repetition timing signal from the plurality of repetition timing signals that is substantially in synchrony with the first flow of digital data with the second coding, said second circuit means comprise a selector that receives said plurality of repetition timing signals and delivers one of said plurality of repetition timing signals to phase comparing means that compare the repetition timing signal delivered by the selector with the first flow of digital data, said phase comparing means operating the selector as a function of the phase difference found so that the repetition timing signal delivered by the selector is delayed to a greater or lesser degree with respect to the local timing signal, whereby the reception of the first flow of digital data and the transmission of the second flow of digital data use a single time base; and means for decoding the first flow of digital data, fed by the repetition timing signal to decode the first flow of digital data by converting the first coding into the second coding, wherein said first coding is of a Coded Mark Inversion (CMI) type, and said second coding is of a Non-Return to Zero (NRZ) type, and means for converting the second flow of digital data, fed by the transmission timing signal from the second coding to the first coding.

2. A bidirectional synchronization interface for a digital circuit to receive and transmit encoded data to remote circuits, comprising:

a first input circuit configured to receive a coded digital data signal of a Coded Mark Inversion (CMI) type and to output an equalized coded digital data signal of the CMI type in synchrony with a local clock signal generated from a single time base;

a delay locked loop (DLL) circuit configured to receive the equalized coded digital data signal and to derive from the local clock signal a transmission timing signal and a plurality of repetition timing signals;

a decode circuit configured to receive a selected repetition timing signal from the DLL circuit and the equalized coded digital data signal of the CMI type and to generate in output to the digital circuit a decoded digital data signal of a Non-Return to Zero (NRZ) type;

a recovery circuit comprising a selector that receives said plurality of repetition timing signals and delivers one of said plurality of repetition timing signals to phase comparing means that compare the repetition timing signal delivered by the selector with the coded digital data signal of the CMI type, said phase comparing means operating the selector as a function of the phase difference found so that the repetition timing signal delivered by the selector is delayed to a greater or lesser degree with respect to the local timing signal; and a second input circuit configured to receive a coded digital data signal of the NRZ type from the digital circuit and to encode the digital data for transmission to the remote circuits as coded digital data of the CMI type using the transmission timing signal received from the DLL circuit.

3. The interface of claim 2, wherein the first input circuit comprises an equalization circuit configured to equalize in modulus and in phase the coded digital data signal.

4. The interface of claim 2, wherein the DLL circuit is configured to generate the plurality of repetition timing signals delayed from one another by fractions of a period, and wherein the recovery circuit is configured to receive the plurality of repetition timing signals and to select the repetition timing signal that is substantially in synchrony with the equalized coded digital data signal.

5. The circuit of claim 4, wherein the recovery circuit comprises a multiplexer configured to receive the plurality of repetition timing signals, and wherein the phase comparator circuit is configured to receive one of the plurality of repetition timing signals from the multiplexer at a time and to send a control signal to the multiplexer to select the repetition timing signal from the plurality of repetition timing signals that has the least phase difference with respect to the equalized coded digital data signal.

6. The interface of claim 5, wherein the repetition timing signal that is substantially in synchrony with the equalized coded digital data signal is delayed with respect to the local timing signal.

7. A method for synchronizing a bidirectional interface to a digital circuit for the reception and transmission of coded digital data signals, the method comprising:

receiving a coded digital data signal of a Coded Mark Inversion (CMI) type from a remote circuit and converting the coded digital data signal into an equalized coded digital data signal of the CMI type and simultaneously receiving a coded digital data signal of a second type from the digital circuit;

generating a plurality of repetition timing signals and a transmission timing signal from a local timing signal having a single time base; and selecting a repetition timing signal from the plurality of repetition timing signals that is substantially in synchrony with the equalized coded digital data signal by comparing the plurality of repetition timing signals to the equalized coded digital data signal in a phase comparator that operates a selector to select the repetition timing signal that is delayed with respect to the local timing signal and that is substantially in synchrony with the equalized coded digital data signal and using the selected repetition timing signal to decode the equalized coded digital data signal from the CMI type to a decoded digital data signal of the second type, and output the decoded digital data signal to the digital circuit, and using the transmission timing signal for encoding the coded digital data signal of the second type as a coded digital data signal of the CMI type to output to the remote circuit.

8. The method of claim 7, wherein the decoded signal of the second type is of Non-Return to Zero (NRZ) type.

9. A bidirectional synchronous interface for the reception and decoding of a first flow of digital data with a first coding n a first communication channel, and for the encoding and transmission on a second communication channel of a second flow of digital data with said first coding in synchrony with a local timing signal, the interface comprising:

synchronization means for synchronizing the interface with the first flow of digital data with the first coding, said synchronization means comprise first circuit means that comprise a delay locked loop circuit fed by said local timing signal having a single time base in order to generate, starting from said local timing signal, a plurality of repetition timing signals delayed from one another by fractions of a period, and second circuit means fed by said first flow of digital data and by said plurality of repetition timing signals suitable for delivering a repetition timing signal from the plurality of repetition timing signals that is substantially in synchrony with the first flow of digital data;

means for decoding the first flow of digital data to a second coding, fed by the delivered repetition timing signal that is in synchrony with the first flow of digital data to decode the first flow of digital data by converting the first coding into the second coding, wherein said first coding is of a Coded Mark Inversion (CMI) type and wherein said second circuit means comprise a selector that receives said plurality of repetition timing signals and delivers one of said plurality of repetition timing signals to phase comparing means that compare the repetition timing signal delivered by the selector with the first flow of digital data, said phase comparing means operating the selector as a function of a phase difference found so that the repetition timing signal delivered by the selector is delayed to a greater or lesser degree with respect to the local timing signal; and means for receiving and converting the second flow of digital data from the second coding to the first coding using a transmission timing signal generated by the delay locked loop circuit from the signal time base.

10. The bidirectional synchronous interface of claim 9, wherein the selector comprises a multiplexer.

11. The bidirectional synchronous interface of claim 9, wherein the phase comparing means comprises a phase comparator circuit configured to compare each of the plurality of repetition timing signals received from the selector and to cause the selector to select as a final output the repetition timing signal that has the least phase difference with respect to the first flow of digital data.

12. A circuit, comprising:

a bidirectional synchronous interface coupled to a digital circuit for the reception and decoding of a first flow of digital data with a first coding from a remote circuit on a first communication channel and for the encoding and transmission to the remote circuit on a second communication channel of a second flow of digital data with the first coding received from the digital circuit in synchrony with a repetition timing signal generated from a local timing signal having a single time base, the interface comprising:

a first circuit that receives the local timing signal and generates therefrom a transmission timing signal and a plurality of repetition timing signals delayed from one another by fractions of a period of the local timing signal;

a second circuit receiving the first flow of digital data with a first coding from the remote circuit and the plurality of repetition timing signals and comprising a selector circuit that receives the plurality of repetition timing signals and a phase comparator circuit coupled to the selector circuit, the selector circuit configured to deliver one of the plurality of repetition timing signals to the phase comparator circuit that compares the repetition timing signal delivered by the selector with the first flow of digital data, the phase comparator circuit operating the selector as a function of a phase difference found between the repetition timing signal and the first flow of digital data so that the repetition timing signal delivered by the selector is delayed to a greater or lesser degree with respect to the local timing signal;

a decoding circuit receiving the first flow of digital data with the first coding from the remote circuit and the repetition timing signal delivered by the selector circuit that is in synchrony with the first flow of digital data to decode the first flow of digital data by converting the first coding into a second coding to output to the digital circuit; and a transmission circuit receiving the second flow of digital data with the second coding from the digital circuit and encoding the same with the first coding for transmission to the remote circuit using the transmission timing signal.

13. The circuit of claim 12, wherein the first coding is of a Coded Mark Inversion (CMI) type.

14. The circuit of claim 13, wherein the second coding is of a Non-Return to Zero (NRZ) type.

15. The circuit of claim 12, wherein the selector circuit comprises a multiplexer.

16. The circuit of claim 12, wherein the phase comparator circuit and the selector circuit cooperate to compare each of the plurality of repetition timing signals with the first flow of digital data and to select a repetition timing signal that has the least phase difference with respect to the first flow of digital data.

17. A circuit, comprising:

a bidirectional synchronous interface for the reception of a first flow of digital data with a first coding on a first communication channel and output with a second coding on the first communication channel and for the reception of a second flow of digital data with the second coding on a second communication channel and transmission of the second flow of data with the first coding on the second communication channel, the interface comprising:

a first circuit having an input for receiving the first flow of digital data and an output on which is generated an equalized coded digital data signal;

a second circuit configured to receive a local timing signal and to generate a transmission timing signal and a plurality of repetition timing signals delayed from one another by fractions of a period of the local timing signal having a single time base;

a third circuit configured to receive the plurality of repetition timing signals and the equalized coded digital data signal and to output one of the plurality of repetition timing signals;

a fourth circuit configured to receive the repetition timing signal from the third circuit and the equalized coded digital data signal from the first circuit and to compare the repetition timing signal delivered by the third circuit with the equalized coded digital data signal and to cause the third circuit as a function of a phase difference found between the equalized coded digital data signal and the repetition timing signal to deliver a repetition timing signal that is delayed to a greater or lesser degree with respect to the local timing signal; and, a fifth circuit configured to receive the second flow of data with the second coding on the second communication channel and to transmit the second flow of data with the first coding on the second communication channel using the transmission timing signal from the second circuit.

18. The circuit of claim 17, wherein the third circuit comprises a selector circuit and the fourth circuit comprises a phase comparator circuit, and wherein the phase comparator circuit cooperates with the selector circuit to select the repetition timing signal from the plurality of repetition timing signals that has the least phase difference with respect to the equalized coded digital data signal.

19. The circuit of claim 18, wherein the selector circuit comprises a multiplexer.

20. The circuit of claim 18, wherein the first flow of digital data is of a Coded Mark Inversion (CMI) type and the equalized coded digital data signal is also of the CMI type.

21. The circuit of claim 18, further comprising a sixth circuit configured to receive the equalized coded digital data signal and the repetition timing signal delivered by the phase comparator and to generate therefrom a decoded digital data signal of a second type.

22. The circuit of claim 21, wherein the decoded digital data signal of the second type is of a Non-Return to Zero (NRZ) type.

* * * * *

UNITED STATES PATENT AND TRADEMARK OFFICE
CERTIFICATE OF CORRECTION

| | |
|---|---|
| PATENT NO. | : 7,106,822 B1 |
| APPLICATION NO. | : 09/632385 |
| DATED | : September 12, 2006 |
| INVENTOR(S) | : Jesus Guinea et al. |

It is certified that error appears in the above-identified patent and that said Letters Patent is hereby corrected as shown below:

Column 6

Line 37, "Non-Return to Zero (NRZ) type" should appear as --a Non-Return to Zero (NRZ) type--

Line 40, "n" should appear as --on--

Column 7

Claim 12, the paragraph structure of the claim should appear as:

--A circuit, comprising:

a bidirectional synchronous interface coupled to a digital circuit for the reception and decoding of a first flow of digital data with a first coding from a remote circuit on a first communication channel and for the encoding and transmission to the remote circuit on a second communication channel of a second flow of digital data with the first coding received from the digital circuit in synchrony with a repetition timing signal generated from a local timing signal having a single time base, the interface comprising:

> a first circuit that receives the local timing signal and generates therefrom a transmission timing signal and a plurality of repetition timing signals delayed from one another by fractions of a period of the local timing signal;

> a second circuit receiving the first flow of digital data with a first coding from the remote circuit and the plurality of repetition timing signals and comprising a selector circuit that receives the plurality of repetition timing signals and a phase comparator circuit coupled to the selector circuit, the selector circuit con figured to deliver one of the plurality of repetition timing signals to the phase comparator circuit that compares the repetition timing signal delivered by the selector with the first flow of digital data, the phase comparator circuit operating the selector as a function of a phase difference found between the repetition timing signal and the first flow of digital data so that the repetition timing signal delivered by the selector is delayed to a greater or lesser degree with respect to the local timing signal;

UNITED STATES PATENT AND TRADEMARK OFFICE
CERTIFICATE OF CORRECTION

| | |
|---|---|
| PATENT NO. | : 7,106,822 B1 |
| APPLICATION NO. | : 09/632385 |
| DATED | : September 12, 2006 |
| INVENTOR(S) | : Jesus Guinea et al. |

It is certified that error appears in the above-identified patent and that said Letters Patent is hereby corrected as shown below:

>   a decoding circuit receiving the first flow of digital data with the first coding from the remote circuit and the repetition timing signal delivered by the selector circuit that is in synchrony with the first flow of digital data to decode the first flow of digital data by converting the first coding into a second coding to output to the digital circuit; and
>
>   a transmission circuit receiving the second flow of digital data with the second coding from the digital circuit and encoding the same with the first coding for transmission to the remote circuit using the transmission timing signal.--

Column 8

Line 38, "and," should appear as --and--

Claim 17, the paragraph structure of the claim should appear as:

--A circuit, comprising:

a bidirectional synchronous interface for the reception of a first flow of digital data with a first coding on a first communication channel and output with a second coding on the first communication channel and for the reception of a second flow of digital data with the second coding on a second communication channel and transmission of the second flow of data with the first coding on the second communication channel, the interface comprising:

>   a first circuit having an input for receiving the first flow of digital data and an output on which is generated an equalized coded digital data signal;
>
>   a second circuit configured to receive a local timing signal and to generate a transmission timing signal and a plurality of repetition timing signals delayed from one another by fractions of a period of the local timing signal having a single time base;
>
>   a third circuit configured to receive the plurality of repetition timing signals and the equalized coded digital data signal and to output one of the plurality of repetition timing signals;

UNITED STATES PATENT AND TRADEMARK OFFICE
CERTIFICATE OF CORRECTION

PATENT NO. : 7,106,822 B1
APPLICATION NO. : 09/632385
DATED : September 12, 2006
INVENTOR(S) : Jesus Guinea et al.

It is certified that error appears in the above-identified patent and that said Letters Patent is hereby corrected as shown below:

a fourth circuit configured to receive the repetition timing signal from the third circuit and the equalized coded digital data signal from the first circuit and to compare the repetition timing signal delivered by the third circuit with the equalized coded digital data signal and to cause the third circuit as a function of a phase difference found between the equalized coded digital data signal and the repetition timing signal to deliver a repetition timing signal that is delayed to a greater or lesser degree with respect to the local timing signal; and a fifth circuit configured to receive the second flow of data with the second coding on the second communication channel and to transmit the second flow of data with the first coding on the second communication channel using the transmission timing signal from the second circuit.--

Signed and Sealed this

Sixth Day of March, 2007

JON W. DUDAS
*Director of the United States Patent and Trademark Office*